(12) United States Patent
Maeng et al.

(10) Patent No.: US 10,056,458 B2
(45) Date of Patent: Aug. 21, 2018

(54) SILOXANE AND ORGANIC-BASED MOL CONTACT PATTERNING

(71) Applicant: GLOBALFOUNDRIES Inc., Grand Cayman (KY)

(72) Inventors: Chang Ho Maeng, Cohoes, NY (US);
Andy Wei, Dresden (DE); Anthony Ozzello, Austin, TX (US); Bharat Krishnan, Clifton Park, NY (US);
Guillaume Bouche, Albany, NY (US);
Haifeng Sheng, Rexford, NY (US);
Haigou Huang, Rexford, NY (US);
Huang Liu, Mechanicville, NY (US);
Huy M. Cao, Rexford, NY (US);
Ja-Hyung Han, Clifton Park, NY (US);
SangWoo Lim, Ballston Spa, NY (US);
Kenneth A. Bates, Happy Valley, OR (US); Shyam Pal, Clifton Park, NY (US); Xintuo Dai, Rexford, NY (US);
Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 79 days.

(21) Appl. No.: 14/993,537

(22) Filed: Jan. 12, 2016

(65) Prior Publication Data

US 2017/0200792 A1  Jul. 13, 2017

(51) Int. Cl.
*H01L 21/3205* (2006.01)
*H01L 29/40* (2006.01)
(Continued)

(52) U.S. Cl.
CPC ...... *H01L 29/401* (2013.01); *H01L 21/02126* (2013.01); *H01L 21/02282* (2013.01);
(Continued)

(58) Field of Classification Search
CPC ............. H01L 27/401; H01L 29/41791; H01L 29/401
See application file for complete search history.

(56) References Cited

U.S. PATENT DOCUMENTS 5,459,086 A * 10/1995 Yang ................. H01L 21/76814
257/E21.576
5,643,407 A * 7/1997 Chang ................. H01L 21/3105
257/E21.241

(Continued)

OTHER PUBLICATIONS

Honeywell, "Honeywell Electronic Materials: Electronic Polymers Overview", Dec. 2014, 18 Pages.

*Primary Examiner* — Jamie C Niesz
(74) *Attorney, Agent, or Firm* — Ditthavong & Steiner, P.C.

(57) ABSTRACT

Methods of MOL S/D contact patterning of RMG devices without gouging of the Rx area or replacement of the dielectric are provided. Embodiments include forming a SOG layer around a RMG structure, the RMG structure having a contact etch stop layer and a gate cap layer; forming a lithography stack over the SOG and gate cap layers; patterning first and second TS openings through the lithography stack down to the SOG layer; removing a portion of the SOG layer through the first and second TS openings, the removing selective to the contact etch stop layer; converting the SOG layer to a $SiO_2$ layer; forming a metal layer over the $SiO_2$ layer; and planarizing the metal and $SiO_2$ layers down to the gate cap layer.

19 Claims, 10 Drawing Sheets

(51) Int. Cl.
  *H01L 29/423* (2006.01)
  *H01L 21/02* (2006.01)
  *H01L 21/28* (2006.01)
  *H01L 29/417* (2006.01)

(52) U.S. Cl.
  CPC .. *H01L 21/28229* (2013.01); *H01L 29/41791* (2013.01); *H01L 29/4232* (2013.01)

(56) References Cited

U.S. PATENT DOCUMENTS

| | | | | |
|---|---|---|---|---|
| 6,074,939 | A * | 6/2000 | Watanabe | H01L 21/84 257/E21.703 |
| 6,165,905 | A * | 12/2000 | Annapragada | H01L 21/76814 257/E21.577 |
| 6,645,879 | B2 * | 11/2003 | Hong | H01L 21/31051 257/E21.243 |
| 7,482,267 | B2 * | 1/2009 | Coppens | H01L 21/76804 257/634 |
| 7,585,786 | B2 * | 9/2009 | Goo | H01L 21/316 438/275 |
| 2013/0248999 | A1 * | 9/2013 | Glass | H01L 29/36 257/335 |
| 2013/0309856 | A1 * | 11/2013 | Jagannathan | H01L 21/845 438/587 |
| 2016/0172356 | A1 * | 6/2016 | Cheng | H01L 27/0629 257/379 |

* cited by examiner

SILOXANE AND ORGANIC-BASED MOL CONTACT PATTERNING

TECHNICAL FIELD

The present disclosure relates to a manufacture of source/drain (S/D) contacts for semiconductor devices. The present disclosure is particularly applicable to the 10 nanometer (nm) technology node and beyond.

BACKGROUND

A known flow for S/D contact formation involves etching silicon oxide ($SiO_2$) over the S/D region of a replacement metal gate (RMG) device. However, because $SiO_2$ is a relatively hard material, the etching can lead to gouging of the active (Rx) area. Another known flow involves replacing the dielectric and using a wet etch for the contact area. However, this makes reactive-ion etching (RIE) difficult and requires replacement of materials.

A need therefore exists for methodology enabling S/D contact formation without gouging of the Rx area or replacement of materials.

SUMMARY

An aspect of the present disclosure is method of a siloxane and organic-based middle-of-line (MOL) contact patterning flow to prevent gouging of the Rx area of a RMG device during direct patterning of the S/D contacts.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a spin-on glass (SOG) layer around a RMG structure, the RMG structure having a contact etch stop layer and a gate cap layer; forming a lithography stack over the SOG and gate cap layers; patterning first and second trench silicide (TS) openings through the lithography stack down to the SOG layer; removing a portion of the SOG layer through the first and second TS openings, the removing selective to the contact etch stop layer; converting the SOG layer to a $SiO_2$ layer; forming a metal layer over the $SiO_2$ layer; and planarizing the metal and $SiO_2$ layers down to the gate cap layer.

Aspects of the present disclosure include forming the SOG layer of a polysilazane-based SOG material. Other aspects include the contact etch stop and gate cap layers being formed of nitride. Further aspects include forming a TEOS layer over the SOG layer; and planarizing the TEOS and SOG layers down to the gate cap layer prior to forming the lithography stack. Additional aspects include forming the lithography stack by: forming a spin-on-hardmask (SOH) layer over the SOG and gate cap layers; forming a silicon oxynitride (SiON) layer over the SOH layer; forming a TEOS memory layer over the SiON layer; forming a buried anti-reflective coating (BARC) layer over the TEOS memory layer; and forming a photoresist layer over the BARC layer. Another aspect includes patterning the first and second TS openings by: patterning the first opening through the photoresist layer down to the BARC layer; etching the first TS opening through the BARC and TEOS memory layers down to the SiON layer; stripping the BARC layer; forming a second BARC layer over the TEOS memory layer and in the first TS opening; forming a second photoresist layer over the second BARC layer; patterning the second TS opening through the second photoresist layer down to the second BARC layer; etching the second TS opening through the second BARC layer and the TEOS memory layer down to the SiON layer; etching the SiON layer through the first and second TS openings down to the SOH layer, the etching being non-selective to the TEOS memory layer; and etching the SOH layer through the first and second TS openings in the SiON layer down to the SOG layer. Other aspects include etching the SiON layer selective to the SOG, contact etch stop, and gate cap layers after removing the portion of the SOG layer; and stripping the SOH layer before converting the SOG layer into the $SiO_2$ layer. Further aspects include removing the portion of the SOG layer by: RIE. Additional aspects include converting the SOG layer into the $SiO_2$ layer by: heating the SOG layer in a furnace at a temperature of 600° C. to 800° C. for approximately one hour or heating the SOG layer at a temperature of 600° C. in a wet anneal condition for 30 minutes. Another aspect includes etching the contact etch stop layer in the first and second TS openings after converting the SOG layer into the $SiO_2$ layer; and forming a barrier layer of titanium (Ti) or titanium nitride (TiN) over the $SiO_2$ and gate cap layers and in the first and second TS openings prior to forming the metal layer. Other aspects include the metal layer being formed of tungsten (W).

Another aspect of the present disclosure is a method including: forming a polysilazane-based SOG layer around a RMG structure, the RMG structure having a nitride contact etch stop layer and a nitride gate cap layer; forming a TEOS layer over the SOG layer; planarizing the TEOS and SOG layers down to the nitride gate cap layer; forming a lithography stack over the SOG and nitride gate cap layers; patterning first and second TS openings through the lithography stack down to the SOG layer; removing a portion of the SOG layer through the first and second TS openings, the removing selective to the nitride contact etch stop layer; converting the SOG layer into a $SiO_2$ layer after removing the portion of the SOG layer by heating the SOG layer in a furnace at a temperature of 600° C. to 800° C. for approximately one hour or heating the SOG layer at a temperature of 600° C. in a wet anneal condition for 30 minutes; etching the nitride contact etch stop layer in the first and second TS openings after converting the SOG layer into the $SiO_2$ layer; forming a barrier layer of Ti or TiN over the $SiO_2$ and gate cap layers and in the first and second TS openings; forming a tungsten (W) layer over the Ti or TiN barrier layer; and planarizing the W, Ti or TiN barrier, and $SiO_2$ layers down to the nitride gate cap layer.

Aspects include of the present disclosure include forming the lithography stack by: forming a SOH layer over the SOG and gate cap layers; forming a SiON layer over the SOH layer; forming a TEOS memory layer over the SiON layer; forming a BARC layer over the TEOS memory layer; and forming a photoresist layer over the BARC layer. Other aspects include patterning the first and second TS openings by: patterning the first opening through the photoresist layer down to the BARC layer; etching the first TS opening through the BARC and TEOS memory layers down to the SiON layer; stripping the BARC layer; forming a second BARC layer over the TEOS memory layer and in the first TS opening; forming a second photoresist layer over the second BARC layer; patterning the second TS opening through the second photoresist layer down to the second BARC layer;

etching the second TS opening through the second BARC layer and the TEOS memory layer down to the SiON layer; etching the SiON layer through the first and second TS openings down to the SOH layer, the etching being non-selective to the TEOS memory layer; and etching the SOH layer through the first and second TS openings in the SiON layer down to the SOG layer. Further aspects include etching the SiON layer selective to the SOG, nitride contact etch stop, and nitride gate cap layers after removing the portion of the SOG layer; and stripping the SOH layer before converting the SOG layer into the $SiO_2$ layer. Additional aspects include removing the portion of the SOG layer by RIE.

A further aspect of the present disclosure is a method including: forming a polysilazane-based SOG layer around a RMG structure, the RMG structure having a nitride contact etch stop layer and a nitride gate cap layer; forming a TEOS layer over the SOG layer; planarizing the TEOS and SOG layers down to the nitride gate cap layer; forming a lithography stack over the SOG and nitride gate cap layers; patterning first and second TS openings through the lithography stack down to the SOG layer, the first and second TS openings being equally arranged; RIE a portion of the SOG layer through the first and second TS openings, the RIE selective to the nitride contact etch stop layer; converting the SOG layer into a $SiO_2$ layer after RIE the portion of the SOG layer by heating the SOG layer in a furnace at a temperature of 600° C. to 800° C. for approximately one hour or heating the SOG layer at a temperature of 600° C. in a wet anneal condition for 30 minutes; etching the nitride contact etch stop layer in the first and second TS openings after converting the SOG layer into the $SiO_2$ layer, the nitride gate cap layer recessed by the etching; forming a barrier layer of Ti or TiN over the $SiO_2$ and gate cap layers and in the first and second TS openings; forming a W layer over the Ti or TiN barrier layer; and planarizing the W, Ti or TiN barrier, and $SiO_2$ layers down to the nitride gate cap layer.

Aspects of the present disclosure include forming the lithography stack by: forming a SOH layer over the SOG and gate cap layers; forming a SiON layer over the SOH layer; forming a TEOS memory layer over the SiON layer; forming a BARC layer over the TEOS memory layer; and forming a photoresist layer over the BARC layer. Other aspects include patterning the first and second TS openings by: patterning the first opening through the photoresist layer down to the BARC layer; etching the first TS opening through the BARC and TEOS memory layers down to the SiON layer; stripping the BARC layer; forming a second BARC layer over the TEOS memory layer and in the first TS opening; forming a second photoresist layer over the second BARC layer; patterning the second TS opening through the second photoresist layer down to the second BARC layer; etching the second TS opening through the second BARC layer and the TEOS memory layer down to the SiON layer; etching the SiON layer through the first and second TS openings down to the SOH layer, the etching being non-selective to the TEOS memory layer; and etching the SOH layer through the first and second TS openings in the SiON layer down to the SOG layer. Further aspects include etching the SiON layer selective to the SOG, nitride contact etch stop, and nitride gate cap layers after removing the portion of the SOG layer; and stripping the SOH layer before converting the SOG layer into the $SiO_2$ layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of gouging and complicated self-aligned contact (SAC) formation attendant upon direct patterning of the S/D contacts over the Rx area of a RMG device.

Methodology in accordance with embodiments of the present disclosure includes forming a SOG layer around a RMG structure, the RMG structure having a contact etch stop layer and a gate cap layer. A lithography stack is formed over the SOG and gate cap layers, and TS openings are patterned through the lithography stack down to the SOG layer. Next, a portion of the SOG layer is removed through the TS openings, the removal selective to the contact etch stop layer. The SOG layer is then converted to a $SiO_2$ layer. Subsequently, a metal layer is formed over the $SiO_2$ layer, and the metal and $SiO_2$ layers are planarized down to the gate cap layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
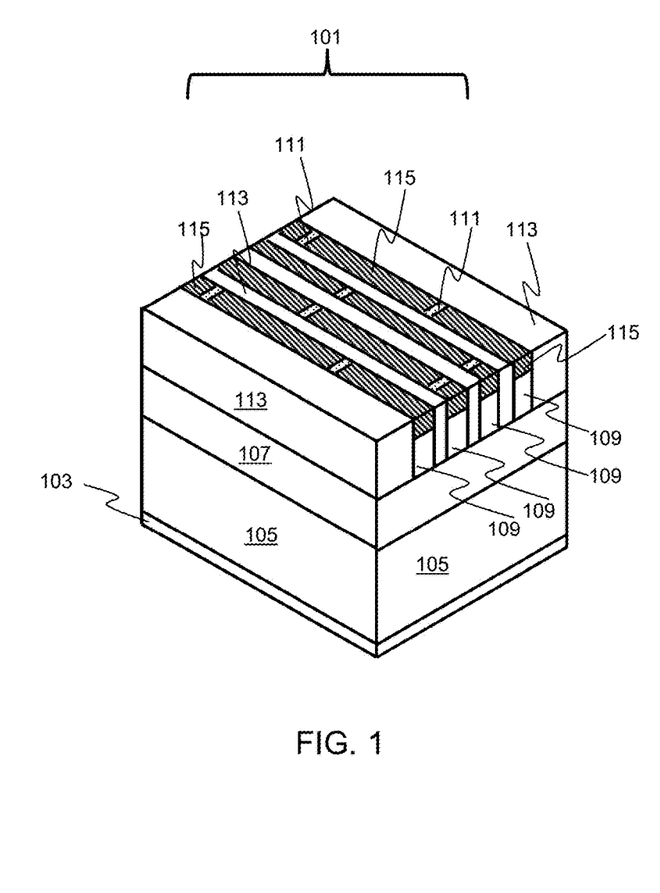
FIGS. 1 through 18 schematically illustrate a siloxane and organic-based MOL contact patterning flow to prevent gouging of the Rx area of a RMG device during direct patterning of the S/D contacts, in accordance with an exemplary embodiment.

FIGS. 1 through 18 (orthographic views) schematically illustrate a siloxane and organic-based MOL contact patterning flow to prevent gouging of the Rx area of a RMG device during direct patterning of the S/D contacts, in accordance with an exemplary embodiment. Adverting to FIG. 1, a pre-metal dielectric (PMD) replacement process is performed by first forming a RMG structure 101. The RMG structure 101 in this example includes a nitride layer 103; a silicon layer 105; a nitride layer (not shown for illustrative convenience), e.g., an etch stop layer; a STI oxide layer 107; a plurality of gates 109; a contact etch stop layer (CESL) 111, e.g., formed of a nitride, and a TEOS layer 113. The gates 109 also include a gate cap layer 115 and spacers (not shown for illustrative convenience).

Figure 2:
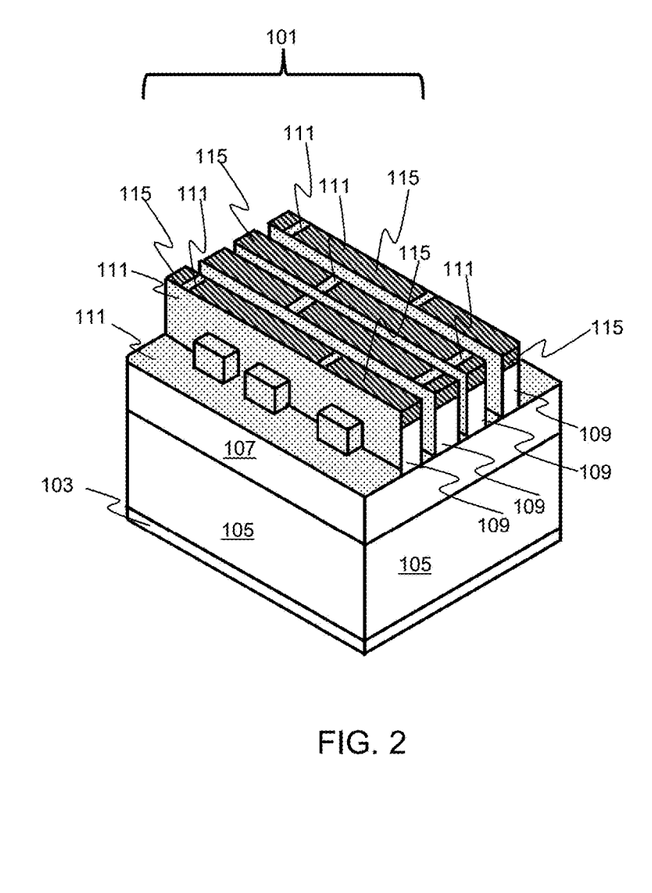
Figure 3:
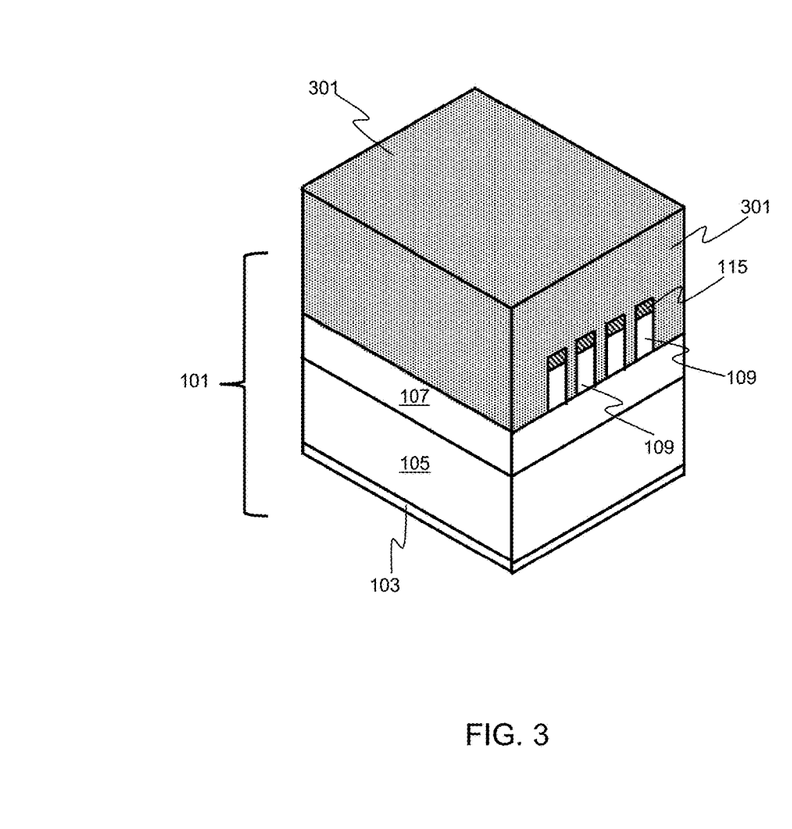
Figure 4:
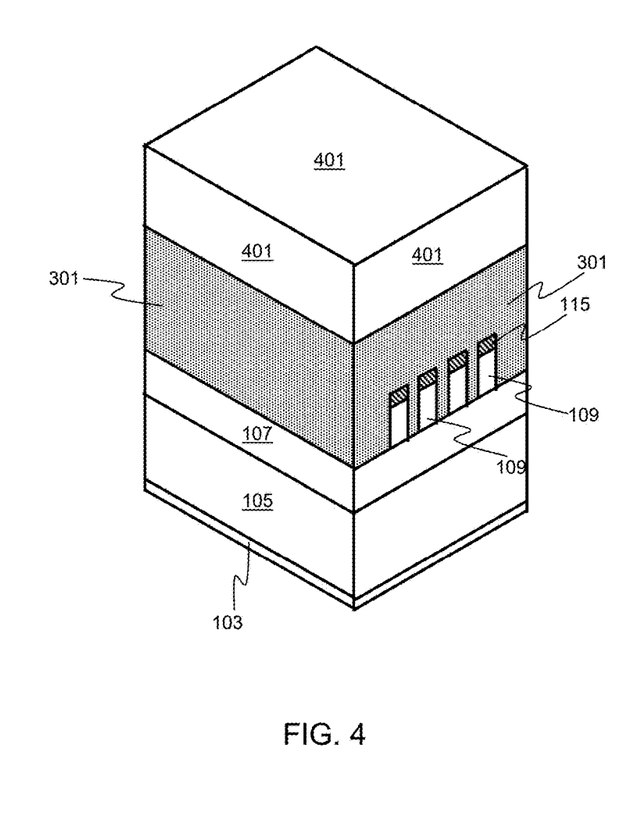
Figure 5:
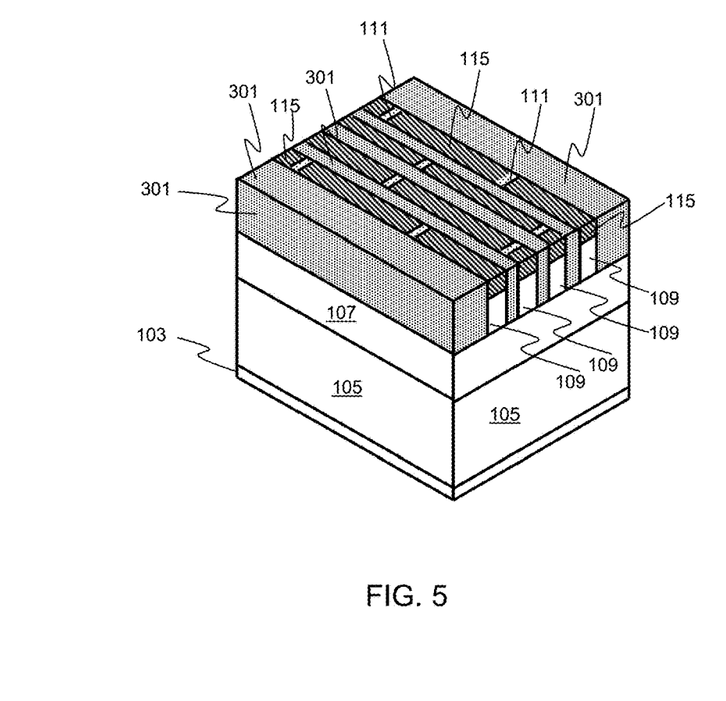

Next, the TEOS layer 113 is stripped, for example, using a wet dilute hydrofluoric acid (dHF) or SiCoNi™, selective to nitride, e.g., the CESL 111 and gate cap layer 115, as depicted in FIG. 2. The small "bumps" on the left side of the drawing are the tops of fins covered by the CESL 111. Adverting to FIG. 3, a SOG layer 301, e.g. formed of a polysilazane-based SOG material, is formed around the RMG structure 101. The SOG layer 301 may be formed, for example, to a thickness of 10 nm to 40 nm using a photo resist coating track through spin and baking at 150° C. A TEOS layer 401 is then formed over the SOG layer 301, as depicted in FIG. 4. Thereafter, the TEOS layer 401 and the SOG layer 301 are planarized, e.g., by chemical mechanical polishing (CMP), down to gate cap layer 115, as depicted in FIG. 5.

Figure 6:
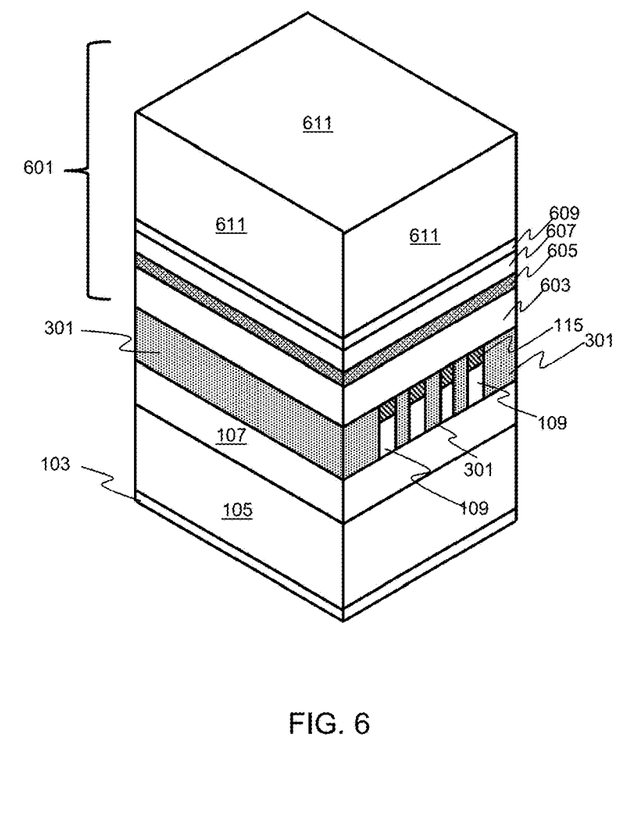
Figure 7:
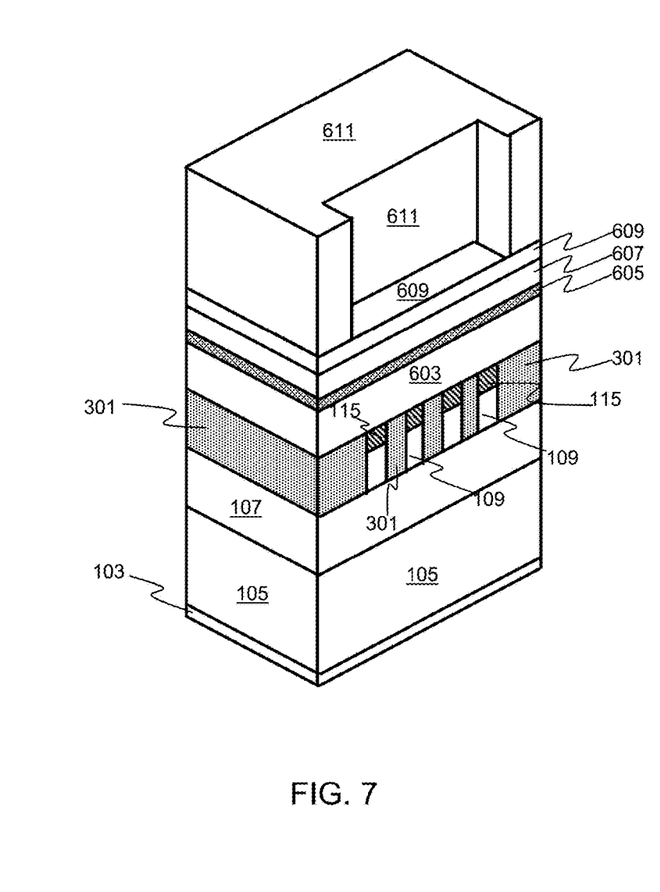
Figure 8:
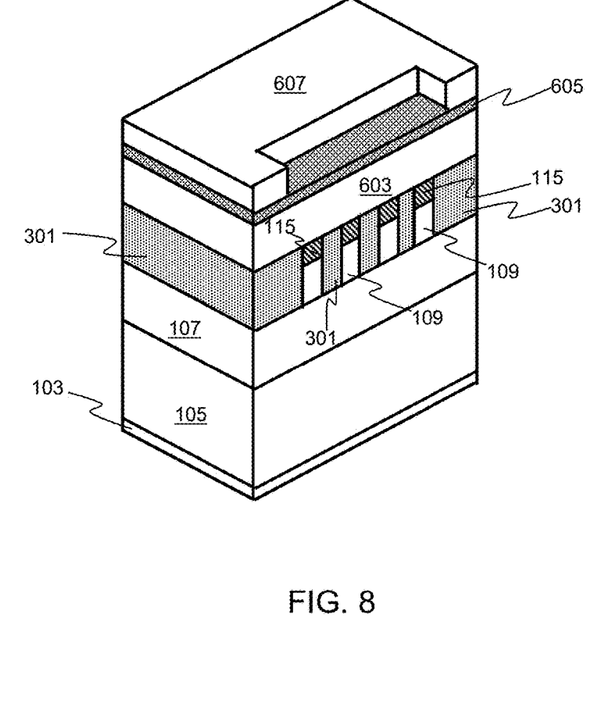
Figure 9:
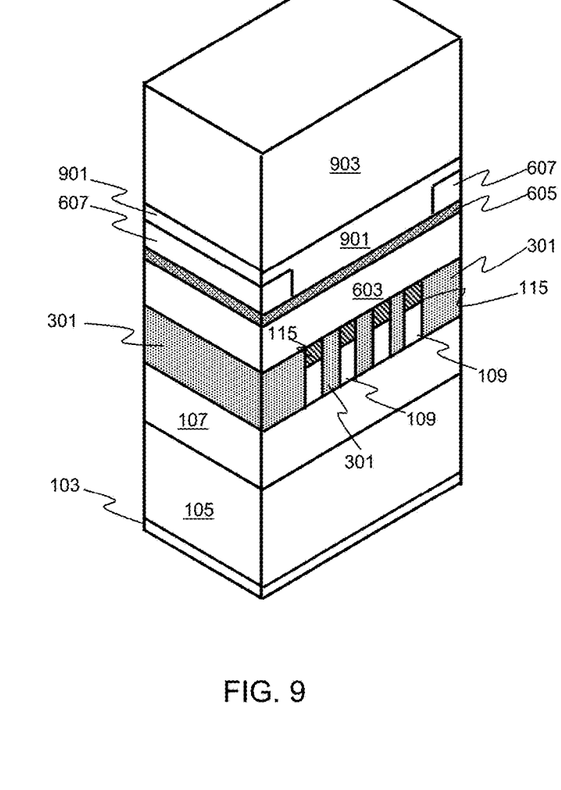
Figure 10:
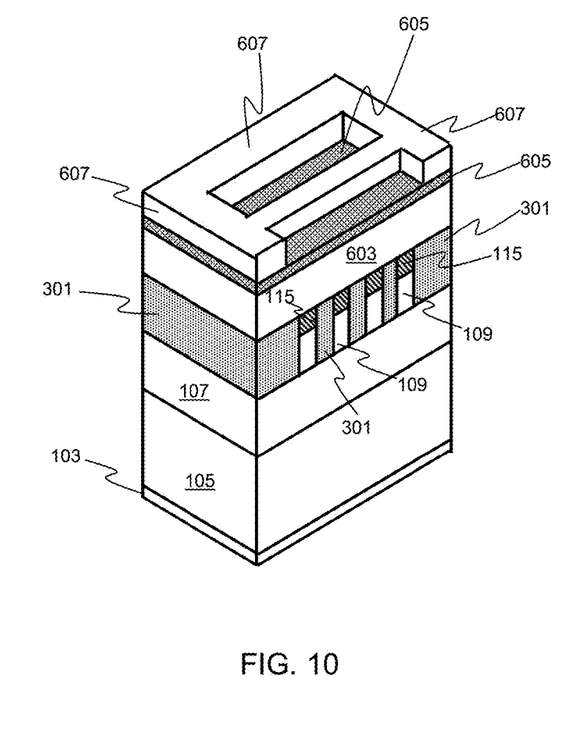

Adverting to FIG. 6, a lithography stack 601 is formed over the SOG layer 301 and the gate cap layer 115. The lithography stack 601 may be formed, for example, of a SOH layer 603, a SiON layer 605, a TEOS memory layer 607, a BARC layer 609, and a photoresist layer 611. The lithography stack 601 is then double-patterned, for example, using two different color TS masks in a lithography/etch/lithography/etch (LELE) scheme. A first TS opening is patterned, for example, through the photoresist layer 611 down to the BARC layer 609, as depicted in FIG. 7. Adverting to FIG. 8, the first TS opening is etched through the BARC layer 609 and the TEOS memory layer 607 down to the SiON layer 605, and then the photoresist layer 611 and the BARC layer 609 are removed. Next, a BARC layer 901 is formed over the TEOS memory layer 607 and in the first TS opening, as depicted in FIG. 9. A photoresist layer 903 is then formed over the BARC layer 901. The second TS opening is patterned (not shown for illustrative convenience), for example, through the photoresist layer 903 down to the BARC layer 901. The second TS opening is etched through the BARC layer 901 and the TEOS memory layer 607 down to the SiON layer 605, and then the photoresist layer 903 and the BARC layer 901 are removed, as depicted in FIG. 10.

Figure 11:
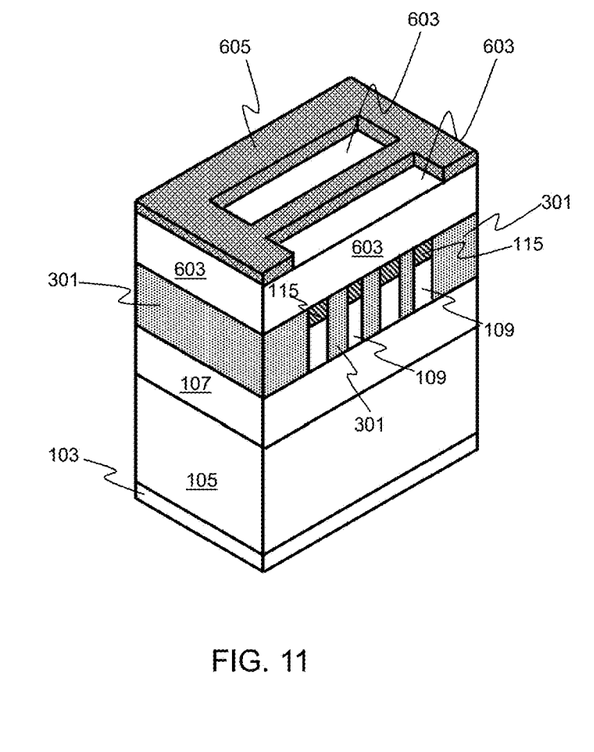
Figure 12:
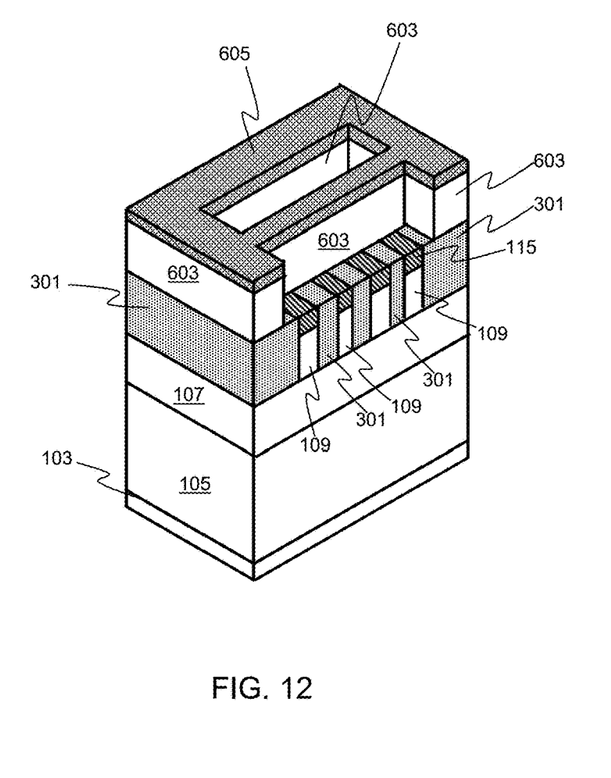
Figure 13:
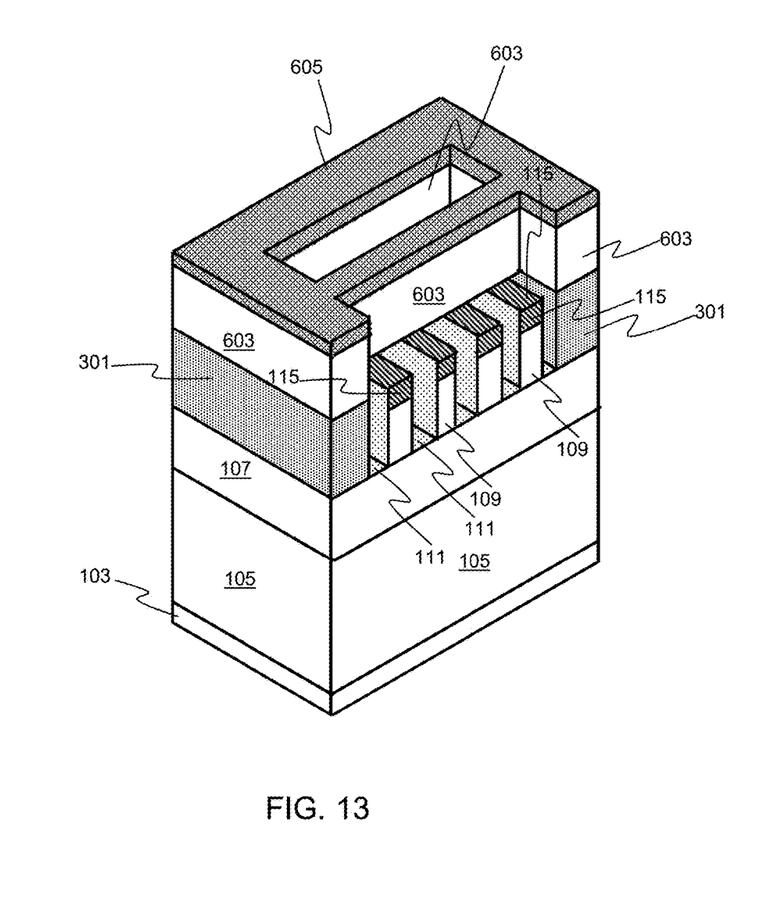

Next, the SiON layer 605 is etched, e.g., by punch etching, non-selective to the TEOS memory layer 607 and, therefore, removing the TEOS memory layer 607, as depicted in FIG. 11. Adverting to FIG. 12, the SOH layer 603 is etched through the first and second TS openings in the SiON layer 605 down to the SOG layer 301. A portion of the SOG layer 301 is then removed through the first and second TS openings by RIE, as depicted in FIG. 13. Because the SOG layer 301 is soft relative to $SiO_2$, it is easy to etch selective to nitride, e.g., the CESL 111 and the gate cap layer 115. For instance, polysilazane contains S—H, S—N bonds and, therefore, may be etched, for example, with chlorine (Cl) and fluorine (F) containing plasma, hexafluorobutadiene ($C_4F_6$) with oxygen ($O_2$), or octafluorocyclobutane ($C_4F_8$) with $O_2$. Consequently, no gouging of the Rx area is expected.

Figure 14:
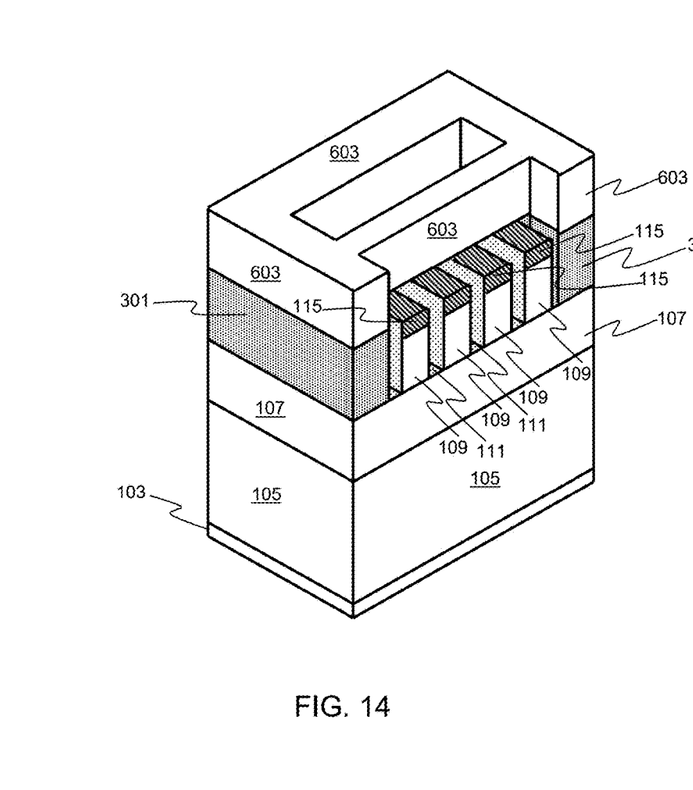
Figure 15:
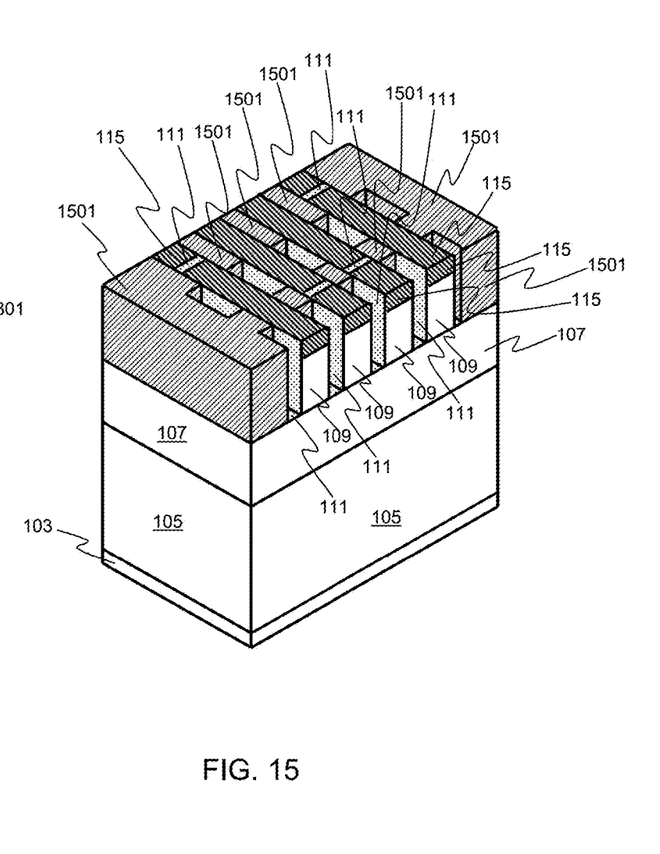

Adverting to FIG. 14, the SiON layer 605 is etched selective (imperfect selectivity) to the SOG layer 301, the CESL 111, and the gate cap layer 115. Next, the SOH layer 603 is stripped, and the SOG layer 301 is converted to a $SiO_2$ layer 1501, as depicted in FIG. 15. The SOG layer 301 is converted to the $SiO_2$ layer 1501, for example, by heating the SOG layer 301 in a high temperature furnace at a temperature of 600° C. to 800° C. for approximately one hour or heating the SOG layer 301 at a temperature of 600° C. in a wet anneal condition for 30 minutes.

Figure 16:
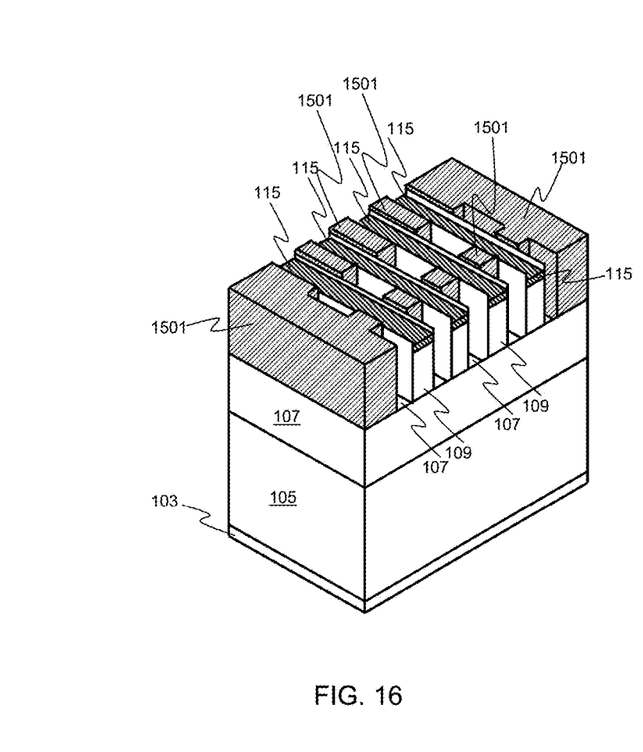
Figure 17:
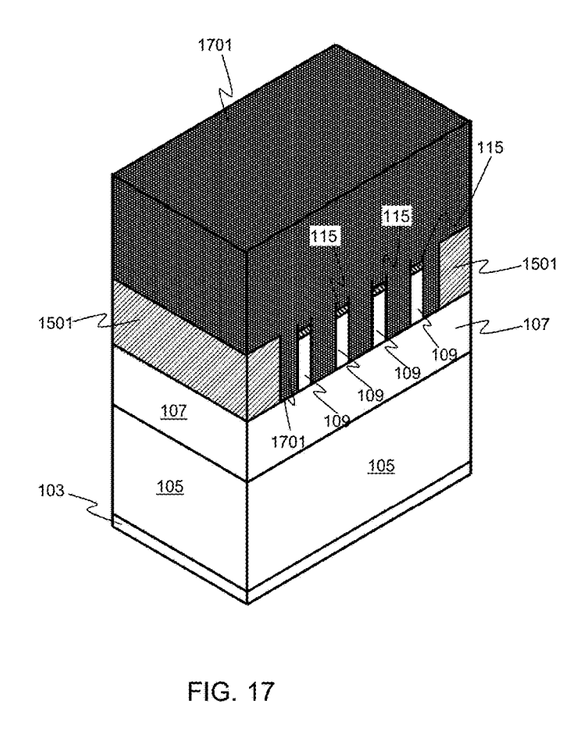
Figure 18:
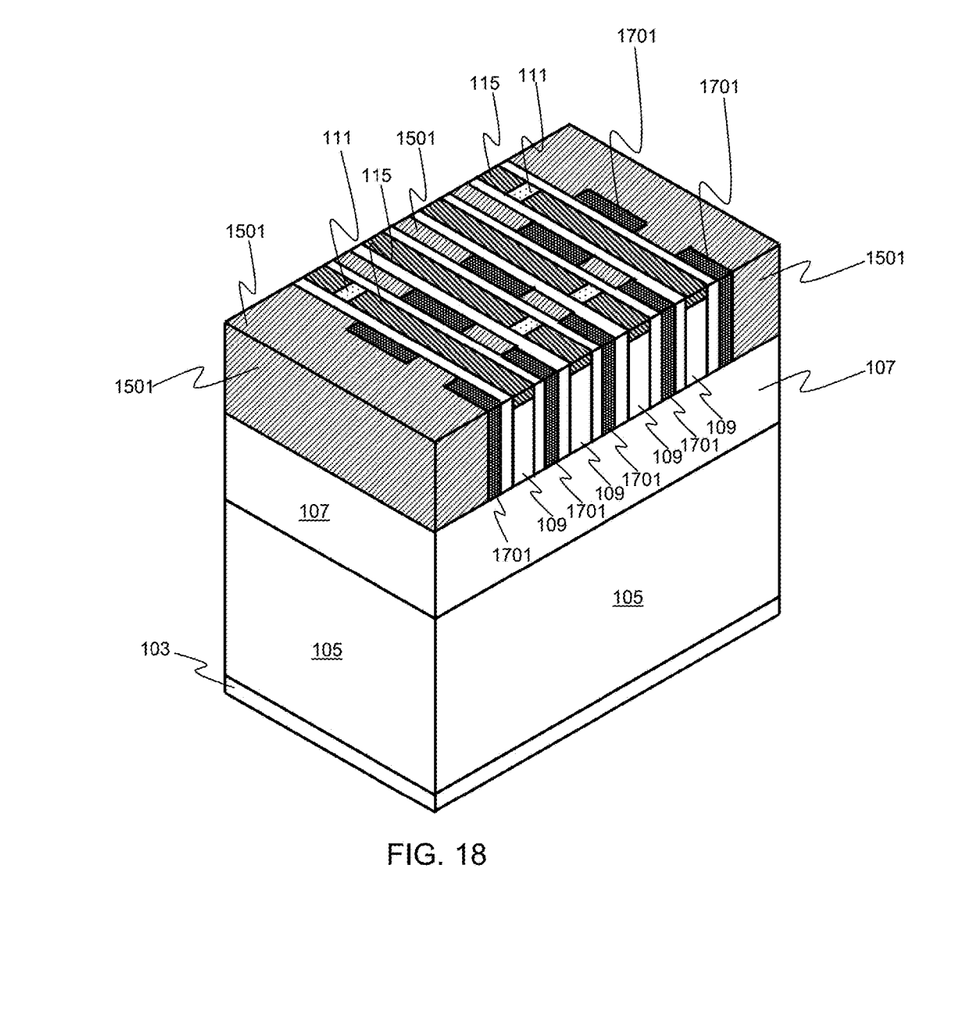

After the SOG layer 301 is converted to the $SiO_2$ layer 1501, the CESL 111 is etched in the first and second TS openings, as depicted in FIG. 16. The etching of the CESL 111 will also erode some of the gate cap layer 115. The recessing of the gates 109 via the partial erosion of the gate cap layer 115 enables a SAC type of integration scheme. A barrier layer (not shown for illustrative convenience) is then formed, e.g., of Ti or TiN, over the $SiO_2$ layer 1501 and the gate cap layer 115 and in the first and second TS openings. Adverting to FIG. 17, a metal layer 1701 is formed, for example, of W, over the barrier layer. The metal layer 1701 and the $SiO_2$ layer 1501 are then planarized, e.g., by CMP, down to the gate cap layer 115, as depicted in FIG. 18.

The embodiments of the present disclosure can achieve several technical effects including taking advantage of siloxane and organic-based materials to enable direct patterning of the S/D contacts of a RMG device without gouging the Rx area or replacing materials. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a spin-on glass (SOG) layer around a replacement metal gate (RMG) structure, the RMG structure having a contact etch stop layer and a gate cap layer;
   forming a TEOS layer over the SOG layer;
   planarizing the TEOS and SOG layers down to the gate cap layer;
   forming a lithography stack over the SOG and gate cap layers;
   patterning first and second trench silicide (TS) openings through the lithography stack down to the SOG layer;
   removing a portion of the SOG layer through the first and second TS openings, the removing selective to the contact etch stop layer;
   converting the SOG layer to a silicon oxide ($SiO_2$) layer;
   etching the contact etch stop layer in the first and second TS openings after converting the SOG layer into the $SiO_2$ layer;
   forming a barrier layer over the $SiO_2$ and gate cap layers and in the first and second TS openings;
   forming a metal layer over the barrier layer; and
   planarizing the metal, barrier and $SiO_2$ layers down to the gate cap layer.

2. The method according to claim 1, comprising forming the SOG layer of a polysilazane-based SOG material.

3. The method according to claim 1, wherein the contact etch stop and gate cap layers comprise nitride.

4. The method according to claim 1, comprising forming the lithography stack by:
   forming a spin-on-hardmask (SOH) layer over the SOG and gate cap layers;
   forming a silicon oxynitride (SiON) layer over the SOH layer;
   forming a TEOS memory layer over the SiON layer;
   forming a buried anti-reflective coating (BARC) layer over the TEOS memory layer; and
   forming a photoresist layer over the BARC layer.

5. The method according to claim 4, comprising patterning the first and second TS openings by:
   patterning the first opening through the photoresist layer down to the BARC layer;
   etching the first TS opening through the BARC and TEOS memory layers down to the SiON layer;
   stripping the BARC layer;
   forming a second BARC layer over the TEOS memory layer and in the first TS opening;
   forming a second photoresist layer over the second BARC layer;
   patterning the second TS opening through the second photoresist layer down to the second BARC layer;
   etching the second TS opening through the second BARC layer and the TEOS memory layer down to the SiON layer;
   etching the SiON layer through the first and second TS openings down to the SOH layer, the etching being non-selective to the TEOS memory layer; and
   etching the SOH layer through the first and second TS openings in the SiON layer down to the SOG layer.

6. The method according to claim 5, comprising:
   etching the SiON layer selective to the SOG, contact etch stop, and gate cap layers after removing the portion of the SOG layer; and
   stripping the SOH layer before converting the SOG layer into the SiO$_2$ layer.

7. The method according to claim 1, comprising removing the portion of the SOG layer by:
   reactive-ion etching (RIE).

8. The method according to claim 1, comprising converting the SOG layer into the SiO$_2$ layer by:
   heating the SOG layer in a furnace at a temperature of 600° C. to 800° C. for approximately one hour or heating the SOG layer at a temperature of 600° C. in a wet anneal condition for 30 minutes.

9. The method according to claim 1, comprising:
   forming the barrier layer of titanium (Ti) or titanium nitride (TiN) over the SiO$_2$ and gate cap layers and in the first and second TS openings prior to forming the metal layer.

10. The method according to claim 1, wherein the metal layer comprises tungsten (W).

11. A method comprising:
    forming a polysilazane-based spin-on glass (SOG) layer around a replacement metal gate (RMG) structure, the RMG structure having a nitride contact etch stop layer and a nitride gate cap layer;
    forming a TEOS layer over the SOG layer;
    planarizing the TEOS and SOG layers down to the nitride gate cap layer;
    forming a lithography stack over the SOG and nitride gate cap layers;
    patterning first and second trench silicide (TS) openings through the lithography stack down to the SOG layer;
    removing a portion of the SOG layer through the first and second TS openings, the removing selective to the nitride contact etch stop layer;
    converting the SOG layer into a silicon oxide (SiO$_2$) layer after removing the portion of the SOG layer by heating the SOG layer in a furnace at a temperature of 600° C. to 800° C. for approximately one hour or heating the SOG layer at a temperature of 600° C. in a wet anneal condition for 30 minutes;
    etching the nitride contact etch stop layer in the first and second TS openings after converting the SOG layer into the SiO$_2$ layer;
    forming a barrier layer of titanium (Ti) or titanium nitride (TiN) over the SiO$_2$ and gate cap layers and in the first and second TS openings;
    forming a tungsten (W) layer over the Ti or TiN barrier layer; and
    planarizing the W, Ti or TiN barrier, and SiO$_2$ layers down to the nitride gate cap layer.

12. The method according to claim 11, comprising forming the lithography stack by:
    forming a spin-on-hardmask (SOH) layer over the SOG and gate cap layers;
    forming a silicon oxynitride (SiON) layer over the SOH layer;
    forming a TEOS memory layer over the SiON layer;
    forming a buried anti-reflective coating (BARC) layer over the TEOS memory layer; and
    forming a photoresist layer over the BARC layer.

13. The method according to claim 12, comprising patterning the first and second TS openings by:
    patterning the first opening through the photoresist layer down to the BARC layer;
    etching the first TS opening through the BARC and TEOS memory layers down to the SiON layer;
    stripping the BARC layer;
    forming a second BARC layer over the TEOS memory layer and in the first TS opening;
    forming a second photoresist layer over the second BARC layer;
    patterning the second TS opening through the second photoresist layer down to the second BARC layer;
    etching the second TS opening through the second BARC layer and the TEOS memory layer down to the SiON layer;
    etching the SiON layer through the first and second TS openings down to the SOH layer, the etching being non-selective to the TEOS memory layer; and
    etching the SOH layer through the first and second TS openings in the SiON layer down to the SOG layer.

14. The method according to claim 12, further comprising:
    etching the SiON layer selective to the SOG, nitride contact etch stop, and nitride gate cap layers after removing the portion of the SOG layer; and
    stripping the SOH layer before converting the SOG layer into the SiO$_2$ layer.

15. The method according to claim 11, comprising removing the portion of the SOG layer by reactive-ion etching (RIE).

16. A method comprising:
    forming a polysilazane-based spin-on glass (SOG) layer around a replacement metal gate (RMG) structure, the RMG structure having a nitride contact etch stop layer and a nitride gate cap layer;
    forming a TEOS layer over the SOG layer;

planarizing the TEOS and SOG layers down to the nitride gate cap layer;
forming a lithography stack over the SOG and nitride gate cap layers;
patterning first and second trench silicide (TS) openings through the lithography stack down to the SOG layer, the first and second TS openings being equally arranged;
reactive-ion etching (RIE) a portion of the SOG layer through the first and second TS openings, the RIE selective to the nitride contact etch stop layer;
converting the SOG layer into a silicon oxide ($SiO_2$) layer after RIE the portion of the SOG layer by heating the SOG layer in a furnace at a temperature of 600° C. to 800° C. for approximately one hour or heating the SOG layer at a temperature of 600° C. in a wet anneal condition for 30 minutes;
etching the nitride contact etch stop layer in the first and second TS openings after converting the SOG layer into the $SiO_2$ layer, the nitride gate cap layer recessed by the etching;
forming a barrier layer of titanium (Ti) or titanium nitride (TiN) over the $SiO_2$ and gate cap layers and in the first and second TS openings;
forming a tungsten (W) layer over the Ti or TiN barrier layer; and
planarizing the W, Ti or TiN barrier, and $SiO_2$ layers down to the nitride gate cap layer.

17. The method according to claim 16, comprising forming the lithography stack by:
forming a spin-on-hardmask (SOH) layer over the SOG and gate cap layers;
forming a silicon oxynitride (SiON) layer over the SOH layer;
forming a TEOS memory layer over the SiON layer;
forming a buried anti-reflective coating (BARC) layer over the TEOS memory layer; and
forming a photoresist layer over the BARC layer.

18. The method according to claim 17, comprising patterning the first and second TS openings by:
patterning the first opening through the photoresist layer down to the BARC layer;
etching the first TS opening through the BARC and TEOS memory layers down to the SiON layer;
stripping the BARC layer;
forming a second BARC layer over the TEOS memory layer and in the first TS opening;
forming a second photoresist layer over the second BARC layer;
patterning the second TS opening through the second photoresist layer down to the second BARC layer;
etching the second TS opening through the second BARC layer and the TEOS memory layer down to the SiON layer;
etching the SiON layer through the first and second TS openings down to the SOH layer, the etching being non-selective to the TEOS memory layer; and
etching the SOH layer through the first and second TS openings in the SiON layer down to the SOG layer.

19. The method according to claim 17, further comprising:
etching the SiON layer selective to the SOG, nitride contact etch stop, and nitride gate cap layers after removing the portion of the SOG layer; and
stripping the SOH layer before converting the SOG layer into the $SiO_2$ layer.

* * * * *